United States Patent
Xue et al.

(10) Patent No.: US 10,957,849 B2
(45) Date of Patent: Mar. 23, 2021

(54) MAGNETIC TUNNEL JUNCTIONS WITH COUPLING-PINNING LAYER LATTICE MATCHING

(71) Applicant: Applied Materials, Inc., Santa Clara, CA (US)

(72) Inventors: Lin Xue, San Jose, CA (US); Chi Hong Ching, Santa Clara, CA (US); Rongjun Wang, Dublin, CA (US); Mahendra Pakala, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/358,475

(22) Filed: Mar. 19, 2019

(65) Prior Publication Data
US 2019/0363246 A1    Nov. 28, 2019

Related U.S. Application Data

(60) Provisional application No. 62/676,119, filed on May 24, 2018.

(51) Int. Cl.
*H01L 43/10* (2006.01)
*H01L 27/22* (2006.01)
*H01L 43/08* (2006.01)

(52) U.S. Cl.
CPC ............ *H01L 43/10* (2013.01); *H01L 27/228* (2013.01); *H01L 43/08* (2013.01)

(58) Field of Classification Search
None
See application file for complete search history.

(56) References Cited

U.S. PATENT DOCUMENTS 6,544,667 B1 * 4/2003 Hosoe .................... G11B 5/656
                                                                      428/664
7,098,495 B2    8/2006 Sun et al.
(Continued)

FOREIGN PATENT DOCUMENTS

KR          101652006 B1     8/2016
KR       20160145622 A      12/2016

OTHER PUBLICATIONS

PCT Notification of Transmittal of the International Search Report and the Written Opinion of the International Searching Authority for International Application No. PCT/US2019/024630; dated Oct. 23, 2019; 13 total pages.

*Primary Examiner* — Long Pham
(74) *Attorney, Agent, or Firm* — Patterson + Sheridan, LLP

(57) ABSTRACT

Embodiments of magnetic tunnel junction (MTJ) structures discussed herein employ a first pinning layer and a second pinning layer with a synthetic anti-ferromagnetic layer disposed therebetween. The first pinning layer in contact with the seed layer can contain a single layer of platinum or palladium, alone or in combination with one or more bilayers of cobalt and platinum (Pt), nickel (Ni), or palladium (Pd), or combinations or alloys thereof, The first pinning layer and the second pinning layer can have a different composition or configuration such that the first pinning layer has a higher magnetic material content than the second pinning layer and/or is thicker than the second pinning layer. The MTJ stacks discussed herein maintain desirable magnetic properties subsequent to high temperature annealing.

20 Claims, 5 Drawing Sheets

(56) References Cited

U.S. PATENT DOCUMENTS

| | | | |
|---|---|---|---|
| 9,299,923 B2 | 3/2016 | Oh et al. | |
| 10,468,592 B1* | 11/2019 | Xue | H01F 10/3254 |
| 2003/0118871 A1* | 6/2003 | Hosoe | G11B 5/7325 |
| | | | 428/831 |
| 2006/0221512 A1* | 10/2006 | Gill | H01L 43/08 |
| | | | 360/324.12 |
| 2010/0096716 A1* | 4/2010 | Ranjan | B82Y 10/00 |
| | | | 257/421 |
| 2014/0021426 A1 | 1/2014 | Lee et al. | |
| 2016/0351799 A1 | 12/2016 | Xue et al. | |
| 2019/0027169 A1 | 1/2019 | Xue et al. | |
| 2019/0348600 A1 | 11/2019 | Xue et al. | |
| 2019/0363246 A1* | 11/2019 | Xue | H01L 43/10 |
| 2020/0135252 A1* | 4/2020 | Gupta | H01L 27/228 |

\* cited by examiner

MAGNETIC TUNNEL JUNCTIONS WITH COUPLING-PINNING LAYER LATTICE MATCHING

PRIORITY CLAIM

This application claims priority to U.S. Provisional Patent Application No. 62/676,119, "Magnetic Tunnel Junctions with Coupling-Pinning Layer Lattice Matching," filed May 24, 2018, and is incorporated by reference herein in its entirety.

BACKGROUND

Field

Embodiments of the present disclosure generally relate to fabricating magnetic tunnel junction structures for magnetic random access memory (MRAM) applications.

Description of the Related Art

Spin transfer torque magnetic random access memories, or STT-MRAMs, employ magnetic tunnel junction structures in the memory cells thereof, wherein two ferro-magnetic layers are spaced from one another by a thin insulating or "dielectric" layer. One of the magnetic layers has a fixed magnetic polarity, the other has a magnetic polarity which is selectively changeable between two states. Where the magnetic layers have perpendicular magnetic anisotropy, the polarity of the changeable polarity layer can be switched between having the same polarity as the fixed polarity layer, or the opposite polarity to that of the fixed polarity layer, in the depth direction of a stack of film layers including the magnetic tunnel junction or "MTJ" structure. The electric resistance across the MTJ is a function of the polarity of the changeable polarity layer with respect to the fixed polarity layer. Where the polarities of the two layers are the same in the depth direction of the MTJ, the electric resistance across the MTJ is low, and when they are opposite to one another in the depth direction of the MTJ, the electric resistance across the MTJ is high. Thus, the electrical resistance across the cell can be used to indicate a value of 1 or 0, and thus store a data value, for example by using the low resistance state as having the data value of 1, and the high resistance state as the data value of 0.

To form an MTJ stack, a film layer stack is fabricated that includes a first pinning layer and a second pinning layer and a synthetic anti-ferrimagnetic coupling (SyF) layer in between the first pinning layer and the second pinning layer. The SyF coupling layer causes surface atoms of the first pinning layer and the second pinning layer, when exposed to a magnetic field, to align with surface atoms of the SyF coupling layer, thereby pinning the orientation of the magnetic moments of each of the first pinning layer and the second pinning layer. The first pinning layer and the second pinning layer each include similar magnetic moments, and will thus react similarly when an external magnetic field is applied to the conventional MTJ stack 100A. The SyF coupling layer maintains an anti-parallel alignment of the magnetic moments of the first and second pinning layers.

Where MTJs employ synthetic anti-ferrimagnet (SyF) layers that include two or more ferromagnetic layers separated by a nonmagnetic layer, SyF coupling can be lost after high temperature processing thereof, for example processing at temperatures at or above about 400° C. Further, dipole fields can be created when a magnetic field is applied to the MTJ stack, magnetic dipoles are closed circulations of electric current, and dipole fields can interfere with the performance of the MTJ stack, including the magnetic storage layer of the MTJ stack.

Thus, there remains a need for an improved MTJ stack that can withstand processing temperatures and reduces the dipole field effect.

SUMMARY

The present disclosure generally relates to the design and fabrication of magnetic tunnel junction (MTJ) stacks used for memory cells.

In one example, a device comprising: a magnetic tunnel junction stack includes a first pinning layer comprising a first bilayer and a first lattice-matching layer formed over the first bilayer, wherein the first lattice-matching layer includes platinum or palladium. The MTJ stack of the device further includes a synthetic anti-ferrimagnetic (SyF) coupling layer in contact with the first lattice-matching layer of the first pinning layer; and a second pinning layer in contact with the SyF coupling layer. The second pinning layer includes a second lattice-matching layer formed from platinum or palladium, the second lattice-matching layer being in contact with the SyF coupling layer.

In one example, a magnetic tunnel junction stack includes: a first pinning layer comprising a first plurality of bilayers and a first lattice-matching layer formed over the first plurality of bilayers, wherein the first lattice-matching layer comprises platinum or palladium, and wherein each bilayer of the first plurality of bilayers comprises a first cobalt interlayer and a second interlayer of platinum, nickel, palladium, or alloys or combinations thereof; a synthetic anti-ferrimagnetic (SyF) coupling layer formed on the first pinning layer; and a second pinning layer formed on the SyF coupling layer, wherein the second pinning layer comprises a second lattice-matching layer formed on the SyF coupling layer In another example, a magnetic tunnel junction (MTJ) stack includes: a buffer layer; a seed layer formed over the buffer layer, the seed layer being formed from chromium; and a first pinning layer in contact with the seed layer. The first pinning layer includes a first bilayer and a first lattice-matching layer formed over the first bilayer, the first lattice-matching layer being formed from at least one of platinum or palladium. The first bilayer includes a cobalt interlayer and at least one interlayer comprising platinum, nickel, or palladium. The MTJ stack further includes a synthetic anti-ferrimagnetic (SyF) coupling layer formed on the first pinning layer; and a second pinning layer formed on the SyF coupling layer, wherein the second pinning layer comprises a second lattice-matching layer formed on the SyF coupling layer, wherein the second lattice-matching layer comprises platinum or palladium. The MTJ stack further includes a structure blocking layer formed on the second pinning layer, wherein the structure blocking layer comprises at least one of tantalum, molybdenum, or tungsten; a magnetic reference layer formed on the structure blocking layer; a tunnel barrier layer formed on the magnetic reference layer; an a magnetic storage layer formed on the tunnel barrier layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
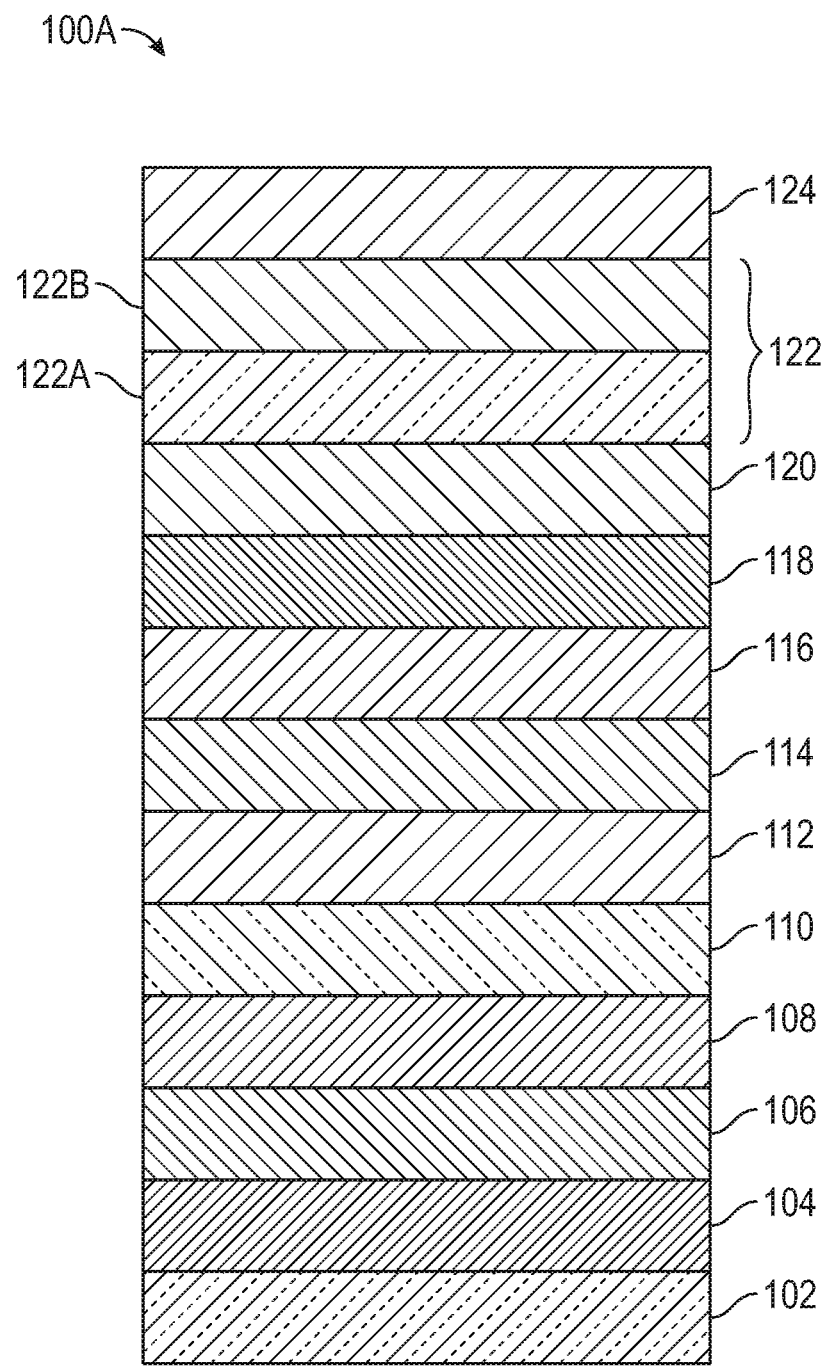
FIG. 1A is a schematic illustration of an example magnetic tunnel junction (MTJ) stack.

Embodiments of the present disclosure relate to magnetic tunnel junction (MTJ) stacks and STT MRAM memory cells and memories. Herein, the MTJ stacks are incorporated in a film stack including upper and lower electrodes such that the MTJ stack is sandwiched therebetween the upper electrodes and the lower electrodes. The MTJ stack can be patterned to form a plurality of individual memory cells used in a magneto-resistive random-access memory (MRAM). In each MTJ stack of an MRAM cell there are two magnetic layers, wherein one magnetic layer has a fixed polarity and the other has a polarity that can be switched by imposing a voltage across the layer or by applying a current to that magnetic layer. The electrical resistance across the MRAM changes based on the relative polarity between the first and second magnetic layers. The first and second magnetic layers are referred to herein as a magnetic reference layer and a magnetic storage layer, respectively. The memory cells formed from the MTJ stacks operate when there is a voltage imposed across the cell or when there is a current passed through the cell. In response to the application of voltage of sufficient strength, the polarity of the switchable magnetic layer can be changed. Additionally, the resistivity of the cell can be determined by measuring the current vs voltage relationship across the cell at a relatively low voltage below the threshold required to switch the magnetic polarity of the magnetic storage layer.

The basic MTJ stack discussed herein is formed using a plurality of deposition chambers to deposit thin film layers on a substrate, and, ultimately, to pattern and etch those deposited film layers. The deposition chambers used to form the MTJ stack discussed herein include physical vapor deposition (PVD) chambers. Here PVD chambers are used to form the plurality of thin film layers of the MTJ stack. The MTJ stack includes a buffer layer, a seed layer on the buffer layer, a first pinning layer on the seed layer, a synthetic anti-ferrimagnetic (SyF) coupling layer on the first pinning layer, a second pinning layer on the SyF coupling layer, and a blocking layer on the second pinning layer. In the PVD operations described hereof, a plasma is formed of an inert or noble gas such as argon (Ar), helium, (He), krypton (Kr), and/or xenon (Xe) in the sputtering chamber while the chamber is maintained in a vacuum state. The PVD process chamber further contains at least one sputtering target and a substrate is disposed therein facing a generally flat surface of the sputtering target. The sputtering target is coupled to a power supply such that the sputtering target is electrically driven to, or self establishes, a cathodic state in a circuit of the power supply, through the plasma, to ground, for example a grounded portion of the sputtering chamber. The substrate is disposed on a pedestal or on another structure in the sputtering chamber, the pedestal or other structure may be at a floating potential, connected to ground, or may be biased to form an anode in the cathodic target to direct plasma to the anode or to the ground circuit. The positively ionized portion of the inert gas atoms in the sputtering chamber are electrically attracted to the negatively biased target, and, thus, ions of the plasma bombard the target, which causes atoms of the target material to be ejected and deposit on the substrate to a form a thin film composed of the target material(s) on the substrate.

In order to form a thin film of a compound, a sputtering target including that compound can be sputtered using an Ar plasma in a PVD chamber. In another example, a plurality of sputtering targets is used to deposit a compound layer on the substrate and each sputtering target includes one or more elements of the compound to be formed as a thin film on the substrate. The plurality of sputtering targets is present in the PVD chamber and can be sputtered using Ar plasma or other gas based plasma to form a desired compound layer on the substrate. Further, in the PVD operations used herein to form layers of the MTJ stack, metal-oxides and metal-nitrides are formed using either a metal-oxide sputtering target or a metal-nitride sputtering target. In alternate embodiments, the metal-oxide or metal-nitride layers of the MTJ stack are formed in a PVD chamber by sputtering one or more sputtering targets composed of the metal of the metal oxide or metal nitride while Ar plasma and either oxygen ($O_2$) or nitrogen ($N_2$) are present in the PVD chamber. In one example, a PVD chamber has a plurality of sputtering targets disposed therein, each sputtering target in the PVD chamber is biased by a power supply to establish a negative bias thereon, either by direct application of a negative DC bias thereto, or by using a waveform to electrically drive or self-establish a cathodic state on the target, or combinations thereof. In this example, a shield inside the PVD chamber is configured to block one or more targets of the plurality of targets from the plasma while allowing ions of the plasma formed in the PVD chamber to bombard at least one of the targets to eject or sputter target material atoms therefrom to form a thin film on the substrate. In this example, one or more sputtering targets are exposed to the Ar plasma, and the sputtering thereof in series or simultaneously forms the desired film composition on the substrate, and a separate PVD chamber is used to form metal-oxide and metal-nitride layers when $O_2$ or $N_2$, respectively, are used in addition to Ar plasma for film layer formation on the substrate.

A PVD system can include one or more PVD sputtering chambers coupled to a central robotic substrate transfer chamber. The central robotic substrate transfer chamber is configured to move substrates between loading stations coupled thereto and the sputtering chambers connected thereto. The PVD system is kept at a base vacuum pressure of, for example, $10 E^{-9}$ Torr, so that the substrate on which the MTJ stack is being formed is not exposed to an external atmosphere when the substrate on which the MTJ stack is being formed is moved among and between PVD chambers during fabrication of the MTJ film layer stack thereon. Prior to forming the initial film layer of the MTJ film layer stack on a substrate, the substrate is degassed in a vacuum chamber and pre-cleaned using an Ar gas plasma or in an He/H gas plasma in a dedicated pre-cleaning chamber connected to the central robotic transfer chamber. During fabrication of the MTJ stack using the one or more PVD chambers, one or more noble or inert sputtering gases such as Ar, Kr, He, or Xe can be disposed in each of the PVD chambers. The gases are ionized to form a plasma in the chamber, and the ions of the plasma bombard the negatively biased sputtering target(s) to eject surface atoms from the target to deposit a thin film of the target material(s) on a substrate located in the PVD sputtering chamber. In an embodiment, a processing pressure in the one or more PVD chambers can be from about 2 mTorr to about 3 mTorr. Depending upon the embodiment, the substrate support pedestal (or other structure on which the substrate can be disposed) in the PVD platform is held at from −200° C. to 600° C. during fabrication of at least the seed layer, the first and second pinning layers, the SyF coupling layer and the buffer layer of the MTJ stack.

FIG. 1A is a schematic illustration of a magnetic tunnel junction (MTJ) stack. FIG. 1A shows a conventional MTJ stack 100A that includes a substrate 102 including a conductive layer of tungsten (W), tantalum nitride (TaN), titanium nitride (Tin), or other metal layers thereof. In some examples, the substrate 102 includes one or more transistors, bit or source lines, and other memory lines, previously fabricated therein or thereon, or other elements to be used to form an MRAM memory and previously fabricated or formed thereon. The substrates on which the MTJ stacks are formed can have dimensions including a diameter of less than 200 mm, a diameter of 200 mm, a diameter of about 300 mm, about 450 mm, or another diameter, and may have a shape of a circle or a rectangular or square panel.

A buffer layer 104 in the conventional MTJ stack 100A is formed on the substrate 102 by sputtering one or more targets in a PVD chamber having the substrate therein, and here includes one or more layers of $Co_xFe_yB_z$, TaN, Ta, or combinations thereof. A seed layer 106 is deposited via sputtering in a PVD chamber over the buffer layer 104. The buffer layer 104 is used in the conventional MTJ stack 100A to improve adhesion of the seed layer 106 to the substrate. The seed layer 106 here includes platinum (Pt) or ruthenium (Ru) and is formed by sputtering a target of Pt or Ru, or an alloy thereof, in a PVD chamber having the substrate therein. The seed layer 106 used to improve adhesion and seeding of subsequently deposited layers in the conventional MTJ stack 100A by reducing or eliminating lattice mismatch between the buffer layer 104 and the seed layer 106.

A first pinning layer 108 is formed on the seed layer 106 by sputtering. The first pinning layer 108 here includes a cobalt (Co) layer, one or more Co-containing bilayers, or a combination of the cobalt layer and one or more Co-containing bilayers. A synthetic anti-ferrimagnetic (SyF) coupling layer 110 is formed here over the first pinning layer 108 by sputtering. The SyF coupling layer 110 can be formed of ruthenium (Ru), rhodium (Rh), Cr, or iridium (Ir) sputtered from a target thereof. A second pinning layer 112 is formed over the SyF coupling layer 110 by sputtering. The second pinning layer 112 is formed here of a single cobalt (Co) layer. The SyF coupling layer 110 is located between the first pinning layer 108 and the second pinning layer 112 and causes surface atoms of the first pinning layer 108 and the second pinning layer 112, when exposed to a magnetic field, to align with surface atoms of the SyF coupling layer 110, thereby pinning the orientation of the magnetic moment of each of the first pinning layer 108 and the second pinning layer 112. The first pinning layer 108 and the second pinning layer 112 each include similar magnetic moments, and will thus react similarly when an external magnetic field is applied to the conventional MTJ stack 100A. The SyF coupling layer 110 maintains an anti-parallel alignment of the magnetic moments of the first 108 and second 112 pinning layers.

A structure blocking layer 114 is formed over the second pinning layer 112, and here includes tantalum (Ta), molybdenum (Mo), tungsten (W), or combinations thereof. The structure blocking layer 114 is employed because of its crystalline structure, which differs from the crystalline structure of the first 108 and second 112 pinning layers. The structure blocking layer 114 prevents against formation of a short circuit between the conventional MTJ stack 100A and metallic contacts that can be coupled to the conventional MTJ stack 100A to form MRAM memory cells.

Further in the conventional MTJ stack 100A, a magnetic reference layer 116 is formed over the structure blocking layer 114 by sputtering in a PVD chamber. A tunnel barrier layer 118 is formed over the magnetic reference layer 116 and a magnetic storage layer 120 is formed over the tunnel barrier layer 118. Each of the tunnel barrier layer 118, the magnetic reference layer 116, and the magnetic storage layer 120 are formed by sputtering a target using an Ar plasma in one or more PVD chambers. The magnetic reference layer 116 and the magnetic storage layer 120 each include a $Co_xFe_yB_z$ alloy which may vary in composition. Additionally, the magnetic storage layer 120 can include one or more layers of Ta, Mo, W, or Hf, or combinations thereof. The tunnel barrier layer 118 includes an insulating material, and can be fabricated from a dielectric material such as MgO. A composition and a thickness of the tunnel barrier layer 118 are selected so as to create a large tunnel magnetoresistance ratio (TMR) in the tunnel barrier layer 118 of the conventional MTJ stack 100A. The TMR is a measurement of a change in resistance in the conventional MTJ stack 100A from the anti-parallel state ($R_{ap}$) to the parallel state ($R_p$) and can be expressed as a percentage using the formula (($R_{ap}$−$R_p$)/$R_p$). When a bias is applied to the conventional MTJ stack 100A, the tunnel barrier layer 118 is traversed by spin-polarized electrons, this transmission of electrons through the tunnel barrier layer 118 results in electrical conduction between the magnetic reference layer 116 and the magnetic storage layer 120.

A capping layer 122 is formed, by sputtering in a PVD chamber, on the magnetic storage layer 120 and here includes a plurality of interlayers. The capping layer 122 includes a first capping interlayer 122A fabricated from a dielectric material such as MgO. A second capping interlayer 122B including a metallic material such as Ru, Ir, Ta, or combinations thereof, is formed over the first capping interlayer 122A. The first capping interlayer 122A acts as an etch stop layer for hard mask etching and protects the MTJ stack 100A from corrosion. The second capping interlayer 122B is configured to electrically communicate with transistors or contacts when the conventional MTJ stack 100A is later patterned, as discussed below with respect to FIG. 1B. A hardmask layer 124 is formed in a PVD chamber by sputtering. The hardmask layer 124 is formed over the second capping interlayer 122B to protect the conventional MTJ stack 100A and can be patterned during subsequent operations.

Figure 1B:
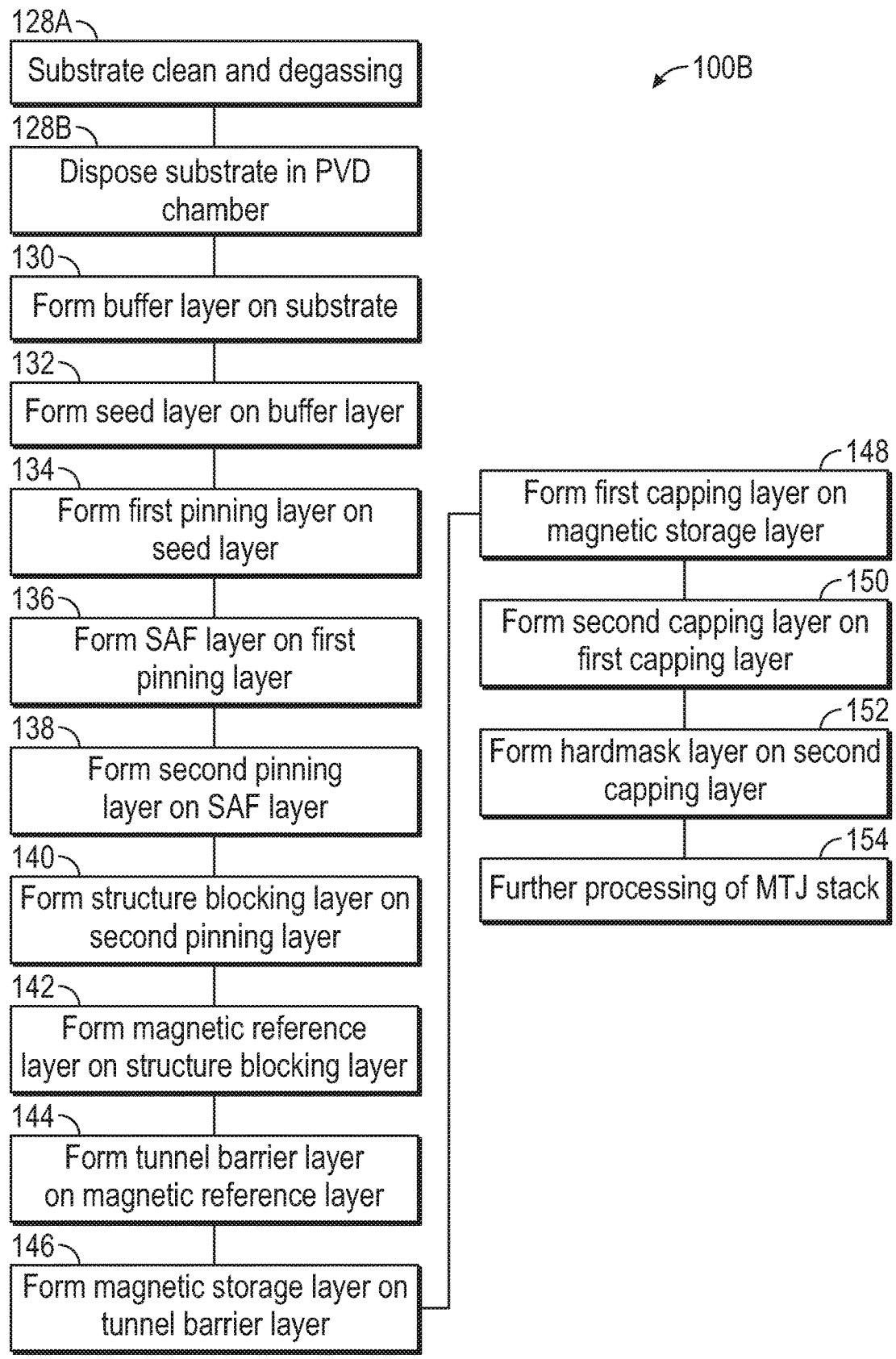
FIG. 1B is a flow diagram of a method of fabricating memory devices including magnetic tunnel junction (MTJ) stacks of FIG. 1A and according to embodiments of the present disclosure.

FIG. 1B is a flow diagram of a method 100B of fabricating memory devices that include an MTJ stack 100A and the MTJ stacks fabricated according to embodiments of the present disclosure and shown in FIGS. 2A-2F. The method 100B is executed in part a plurality of PVD chambers of a PVD system that are configured to deposit thin film layers by sputtering. The substrate 102 can be moved among and between sputtering chambers via the central robotic transfer chamber of the PVD system to form various thin film layers, including the MTJ stack 100A in FIG. 1A and the MTJ stacks shown and discussed below that are fabricated according to embodiments of the present disclosure. In another example, as discussed above, a plurality of sputtering targets is disposed in a PVD chamber and a shield inside the PVD chamber is configured to selectively protect the plurality of sputtering targets from plasma exposure or expose a target thereto. The shield is rotated at different operations of the method 100B to expose one or more targets, in series or simultaneously, to the plasma in the PVD chamber.

The layers of FIG. 1A are thus referenced herein with respect to the method 100B. The operations of the method 100B are performed using one or more gases including argon (Ar), helium (He), krypton (Kr), xenon (Xe), oxygen ($O_2$), or nitrogen ($N_2$) as a plasma species in the PVD chamber or chambers. The processing pressure in the PVD chambers during the method 100B can be from about 2 mTorr to about 3 mTorr. Depending upon the embodiment, the substrate support pedestal (or other structure on which the substrate can be disposed) in the PVD platform is held at from −200° C. to 600° C. during fabrication of the pinning and seed layers of the MTJ stack.

The substrate 102 can be moved among and between PVD chambers depending upon the composition of the sputtering target(s) used for each layer of the MTJ stack 100A, or, as discussed herein, a plurality of targets is coupled to a power supply and a shield is configured to selectively protect some of the targets, such that one or more targets are exposed in series or simultaneously to form the desired film composition, or both methodologies can be performed. During sputtering in the PVD chamber, when Ar is used as the sputtering gas, the Ar ions of the plasma bombard the one or more exposed sputtering targets, causing surface atoms of the sputtering targets to be ejected and deposit as a thin film on the substrate. In the method 100B, at operation 128A, a substrate such as the substrate 102 in FIG. 1A undergoes operations including degassing and pre-cleaning in an Ar gas plasma or in a He/H plasma. During the method 100B, the substrate is moved between process chambers through or via a central robotic substrate transfer chamber. At operation 128B, the substrate 102 is transferred from the central robotic substrate transfer chamber to a PVD chamber of a plurality of PVD chambers. Subsequently, at operation 130, the buffer layer 104 is deposited on the substrate 102 by sputtering in the target of the PVD chamber. A power from 1 kW to 100 kW is applied to the one or more PVD chambers discussed herein to ionize a portion of the Ar and form the plasma used in operation 130. The ejected surface atoms of the target are deposited on the substrate 102 to form the buffer layer 104.

During formation of the buffer layer 104 at operation 130, a sputtering target or targets including $Co_xFe_yB_z$, TaN, and/or Ta are sputtered in the PVD chamber using Ar plasma to form the buffer layer 104. In an embodiment where the buffer layer 104 is or includes Ta, the buffer layer 104 is sputtered in a PVD chamber using a Ta target and Ar plasma. In an example where the buffer layer 104 is or includes TaN, operation 130 is performed when nitrogen gas ($N_2$) is present in the PVD chamber and Ar plasma is used to sputter a Ta sputtering target to form the TaN buffer layer 104. In another example where the buffer layer 104 is or includes TaN, operation 130 is performed in a PVD chamber using a TaN sputtering target and Ar plasma to form the buffer layer 104. During formation of the buffer layer 104 and subsequent layers, the one or more PVD chambers used are maintained at vacuum pressure.

Subsequently, in operation 132, the seed layer 106 is deposited on the buffer layer 104 by sputtering a target in a PVD chamber. In an embodiment of operation 132, the seed layer 106 is formed in the same PVD chamber as the PVD chamber that was used to form the buffer layer 104, using a different sputtering target than the sputtering target used to deposit the buffer layer 104. The first pinning layer 108 is deposited on the seed layer 106 at operation 134 by sputtering a target in a PVD chamber. The first pinning layer 108 is shown as an example in the conventional MTJ stack 100A, and can be formed at operation 134 in a PVD chamber by sputtering one or more targets using Ar plasma. In an example where the first pinning layer 108 is Co layer, a Co target sputtered using Ar plasma in the PVD chamber. In an example where the first pinning layer 108 includes one or more bilayers, operation 134 uses a Co sputtering target to form the first interlayer of the bilayer and uses another sputtering target composed of a different element to form the second interlayer of the bilayer. Depending upon the embodiment, the Co sputtering target and the sputtering target of the other element can be sputtered using Ar plasma in the same PVD chamber or each layer of the bilayer can be formed in separate PVD chambers.

Figure 2A:
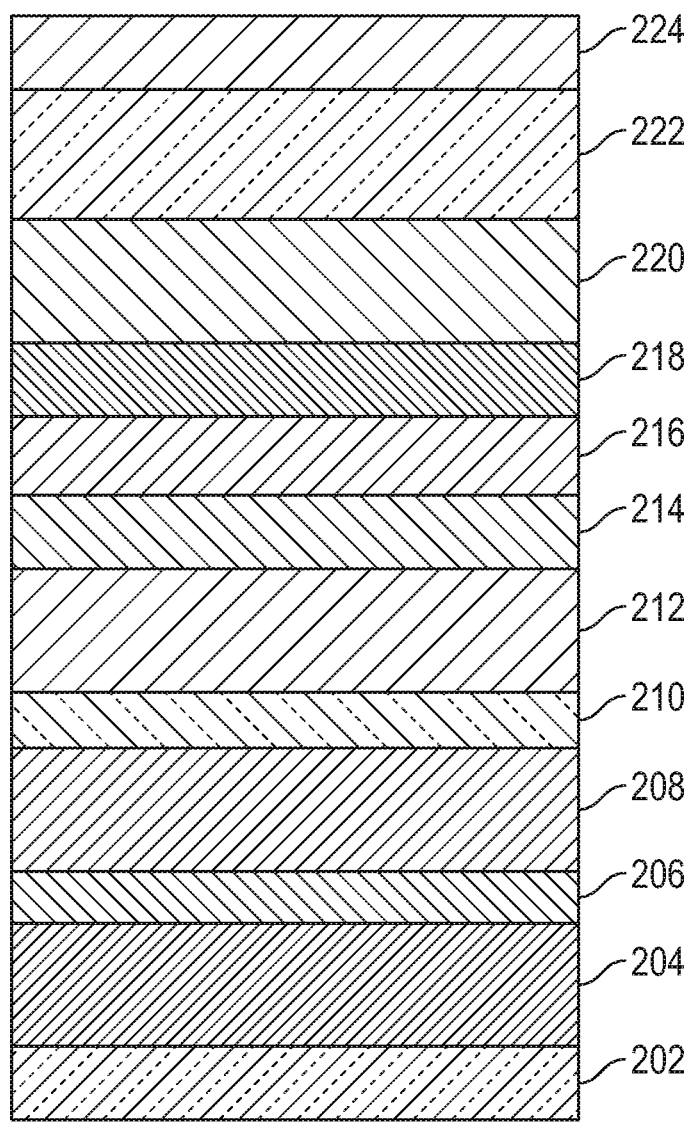
FIG. 2A is a schematic illustration of an MTJ stack according to embodiments of the present disclosure.
Figure 2B:
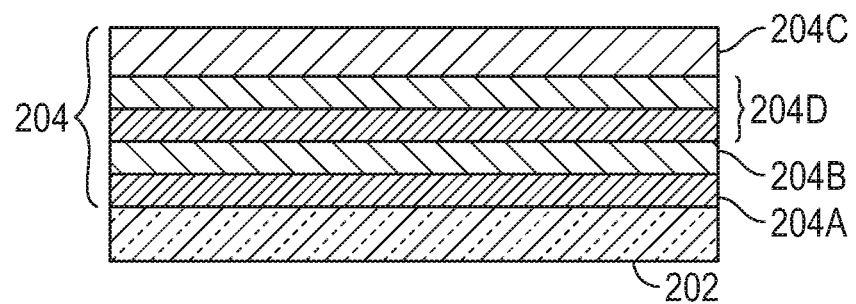
FIG. 2B is a magnified view of the buffer layer of an MTJ stack according to embodiments of the present disclosure.
Figure 2C:
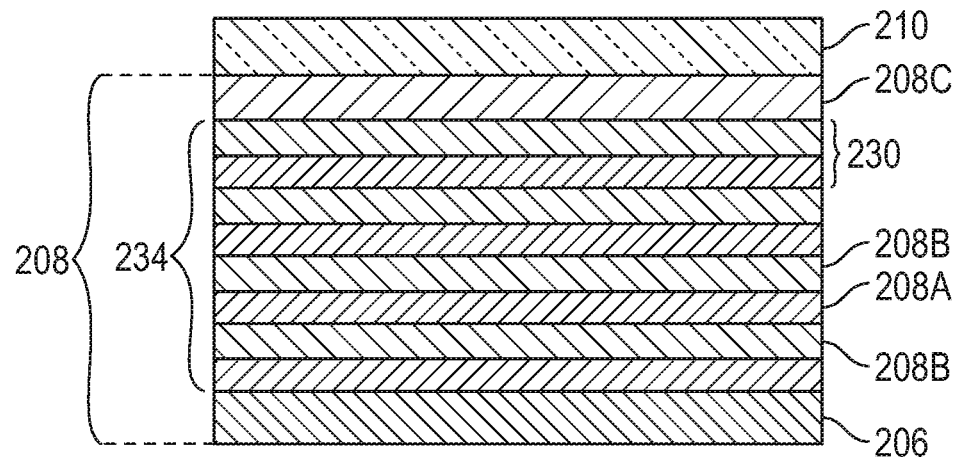
FIG. 2C is a magnified view of the first pinning layer of an MTJ stack according to embodiments of the present disclosure.

In an example according to embodiments of the present disclosure, which can be combined with other examples herein, a first pinning layer 208 as shown in FIGS. 2A and FIG. 2C is formed using a PVD chamber at operation 134. In this example, the first pinning layer 208 is formed in the PVD chamber at operation 134 using one or more sputtering targets. To deposit the first pinning layer 208, xenon (Xe) or argon (Ar) gas is introduced to the PVD chamber at a flow rate of about 2 sccm-40 sccm. The Xe or Ar gas is introduced to the PVD chamber while a power from 50 W to 10000 W is applied to the target at a negative voltage to form a plasma. In another example, the Xe or Ar gas is introduced to the PVD chamber at a flow rate from 5 sccm to 20 sccm, and, in some examples, at a flow rate of 10 sccm. In another example, the power applied to the one or more sputtering targets used to form the first pinning layer 208 is from 100 W to 800 W, and, another example, the power applied to the one or more sputtering targets can be 400 W.

Depending upon a composition of the first pinning layer 208, Xe gas can be used in the sputtering operation in the PVD chamber at operation 134 to form the plasma since it is a heavier gas than Ar, and therefore yields ions with higher atomic weights than the ions formed using Ar or other, lighter, gases. Thus, the Xe plasma bombards the target with more energy than the Ar plasma and can be used to sputter deposit layers such as Pt. In one example of the first pinning layer 208 in the present disclosure, Xe, Ar or a mixture thereof is introduced into the PVD chamber at a flow rate from about 10 sccm and a power of 400 W is applied to the target at a negative voltage to form Ar or Xe plasma. In one example, the first pinning layer 208 is fabricated from a lattice-matching layer of Pd or Pt by sputtering a Pd target or a Pt target. The lattice-matching layer of the first pinning layer 208 is from about 1 Å to about 3 Å thick.

In another example, the first pinning layer 208 includes at least one bilayer that includes two interlayers, and the lattice-matching layer including Pt or Pd is formed over the at least one bilayer, as shown in FIG. 2C. In an example where at least one bilayer is used to form the first pinning layer 208 in addition to the lattice-matching layer, the bilayer includes a first interlayer of Co and a second interlayer of another element such as Pt, Pd, or Ni, or combinations or alloys thereof. The bilayer of the first pinning layer 208 can be formed at operation 134 in a PVD chamber which includes a plurality of targets including the Co target and a target formed from Pt, Pd, or Ni, or combinations or alloys thereof, or in separate PVD chambers, one PVD chamber containing a Co target and the other PVD chamber containing a target of Pt, Pd, or Ni, or combinations or alloys thereof. In one example, the plurality of sputtering targets is disposed in a single PVD chamber and sputtered using Ar plasma and/or Xe plasma. Each of the Co target and the target of the other element can be selectively exposed to the plasma using the shield discussed herein. The selective target exposure forms the Co interlayer of the bilayer and to form an interlayer of the other element to form a resultant bilayer. The interlayer depositions can be repeated at operation 134 for a plurality of iterations to form one or more bilayers of the first pinning layer 208, as shown in FIG. 2C.

The SyF coupling layer 110 is deposited on the first pinning layer 108 at operation 136 by sputtering a target of Ru, Cr, Rh, or Ir in a PVD chamber using Ar, Kr, or Xe plasma. In one example of an SyF coupling layer 210 according to embodiments of the present disclosure as shown in FIG. 2A, the SyF coupling layer 210 is deposited in a PVD chamber at operation 136 using a sputtering target of Ru, Cr, Rh, or Ir. In one example of forming the SyF coupling layer 210 at operation 136, an Ir sputtering target is sputtered in the PVD chamber using Kr or Xe as the plasma gas. The Xe gas or Kr gas, from which the plasma is formed, is introduced into the PVD chamber at a flow rate from 10 sccm to 25 sccm, and in some examples, at a gas flow rate of 16 sccm. In another example of forming the SyF coupling layer 210 at operation 136, a Ru sputtering target is sputtered in the PVD chamber using Ar plasma. The Ar gas used to form plasma to sputter the Ru target is introduced to the PVD chamber at a gas flow rate which can be, for example, from 2 sccm to 10 sccm, and, in some examples, the Ar gas flow rate is 6 sccm. Further in the example at operation 136, when either Kr, Xe, or Ar gas is used in the PVD chamber, a power from between 150 W and 300 W is applied to the target at a negative voltage to form and maintain the Kr, Xe, or Ar plasma. In other example, a power of about 250 W is applied to the target. The SyF coupling layer 210 is deposited at operation 136 in contact with a lattice-matching layer of the first pinning layer 208.

The second pinning layer 112 is deposited on the SyF coupling layer 110 in a PVD chamber at operation 138. In one example, the second pinning layer 112 is formed of Co using a Co target and Ar plasma in the PVD chamber. In another example, the second pinning layer 112 includes a bilayer, and may or may not include a Co layer formed in contact with the bilayer. In this example, the second pinning layer 112 is formed in a PVD chamber using a Co sputtering target and a second metal sputtering target, and a shield is adjusted to expose each of the Co and second metal sputtering targets separately, in at least one iteration, to form one or more bilayers of the second pinning layer 112. In other examples, each layer of the bilayer of the second pinning layer 112 can be formed in a different PVD chamber, where one PVD chamber includes a Co sputtering target and the other PVD chamber includes a sputtering target of the second metal.

Figure 2D:
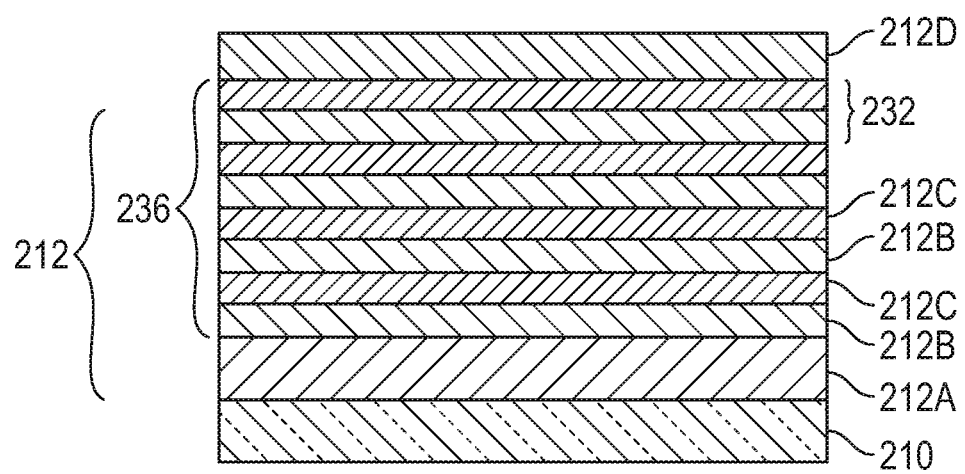
FIG. 2D is a magnified view of the second pinning layer of an MTJ stack according to embodiments of the present disclosure.

In one example of a second pinning layer 212 according to embodiments of the present disclosure as shown in FIGS. 2A and 2D, the second pinning layer 212 is deposited in a PVD chamber at operation 138 using Ar plasma and/or Xe plasma, depending upon the target material being sputtered. In an embodiment of the present disclosure, the second pinning layer 212 is fabricated at operation 138 of a lattice-matching layer of Pt that is deposited on the SyF coupling layer 210 by sputtering a Pt target with Xe plasma. In an embodiment, the second pinning layer 212 further includes a bilayer that includes a first interlayer of Co and a second interlayer of Pt, Ni, or Pd. The bilayer is formed on the lattice-matching layer of the second pinning layer 212.

In an example where at least one bilayers is formed as a part of the second pinning layer, the bilayer is formed in a PVD chamber using a Co sputtering target to form the first interlayer of the bilayer and a second metal sputtering target to form the second interlayer of the bilayer. The second sputtering target can be formed from Pt, Pd, or Ni. In another example, the second sputtering target can be formed from an alloy including one or more of Pt, Pd, or Ni, and a shield is adjusted to expose each of the Co and second metal sputtering targets separately, in at least one iteration, to form one or more bilayers of the second pinning layer 212. Xenon can be used to deposit the second pinning layer 212 when metals such as Pt are used to form the second pinning layer 212 since Xe is a heavier gas than Ar gas and can thus interact with heavier metals including Pt more effectively during sputtering processes in a PVD chamber. In an embodiment, the second pinning layer 212 further includes a Co layer formed over the at least one bilayer. The Co layer formed over the at least one bilayer can have a thickness of up to 10 Å. In an embodiment, the second pinning layer 212 can have a total thickness from 0.3 nm to 15 nm. In an embodiment where Xe gas is used to form plasma in the PVD chamber, the Xe gas is introduced into the PVD chamber at a flow rate from about 2 sccm to about 40 sccm, or from 5 sccm to 20 sccm, and, in some embodiments, the Xe gas is introduced into the PVD chamber at a flow rate of about 10 sccm. During the formation of the second pinning layer 212, a power from 50 W to about 1000 W is applied to the target at a negative voltage to form and maintain the Ar and/or Xe plasma. In some examples, a power from 100 W to 600 W is applied to the target at a negative voltage to form and maintain the Ar and/or Xe plasma, and, in some embodiments a power of about 200 W is applied to the target at a negative voltage.

The structure blocking layer 114 is formed at operation 140 in a PVD chamber that includes sputtering targets including Ta, Mo, and/or W, depending upon an intended composition of the structure blocking layer 114. When two or more sputtering targets of Ta, Mo, and W are used, each target may be used in a separate PVD chamber, or the two or more sputtering targets can be sputtered sequentially or simultaneously in the PVD chamber using the shield adjustment discussed above, depending upon the intended composition of the structure blocking layer 114. The magnetic reference layer 116 is subsequently deposited on the structure blocking layer 114 at operation 142, and can be formed in a PVD chamber where other layers of the MTJ stack 100A may also be formed. This may depend, for example, upon the composition of other layers such as the buffer layer 104, if both the buffer layer 104 and magnetic reference layer 116 are $Co_xFe_yB_z$-based. The magnetic reference layer 116 can be formed in a PVD chamber using a sputtering target that is a $Co_xFe_yB_z$ alloy. In other examples, the magnetic reference layer 116 can be deposited using individual sputtering targets of Co, Fe, or B, or by a combination of an alloy sputtering target and a single-element sputtering target, e.g., a CoFe target and a B target.

The tunnel barrier layer 118 is deposited on the magnetic reference layer 116 at operation 144. In one example of operation 144, the tunnel barrier layer 118 is formed in a PVD chamber using a metal-oxide target such as MgO and Ar gas based plasma. In an alternate embodiment, the tunnel barrier layer 118 is formed in the PVD chamber at operation 144 using a metal target such as Mg, Ti, Hf, Ta, or Al and Ar gas based plasma while $O_2$ is present in the PVD chamber to form the metal-oxide of the tunnel barrier layer 118. At operation 146, the magnetic storage layer 120 is formed in a PVD chamber. The formation of the magnetic storage layer 120 can occur in various ways depending upon the intended composition. The magnetic storage layer 120 can include one or more layers of $Co_xFe_yB_z$, and, in some examples, one or more layers of Ta, Mo, W, or Hf. As such, the deposition of the magnetic storage layer 120 in the PVD chamber can include Ar plasma and a $Co_xFe_yB_z$ alloy target, or individual targets of Co, Fe, and B, or a combination of an alloy target and an element target such as a CoFe target and a B target. In examples where the magnetic storage layer 120 includes Ta, Mo, W, or Hf, a sputtering target of Ta, Mo, W, or Hf is sputtered in the chamber using plasma formed from Ar.

In one example, the magnetic storage layer 120 can be formed in a single PVD chamber using an Ar plasma. The magnetic storage layer 120 can be deposited by adjusting a shield to expose or protect one or more targets such as those discussed above that are used to form $Co_xFe_yB_z$ and layers of Ta, Mo, W, or Hf. In another example, a $Co_xFe_yB_z$ layer of the magnetic storage layer 120 is sputtered in a PVD chamber using a $Co_xFe_yB_z$ alloy target using Ar plasma. In another example, the $Co_xFe_yB_z$ layer is formed in the PVD chamber by using individual Co, Fe, and B, targets and Ar gas based plasma. In still another example, the $Co_xFe_yB_z$ layer is formed in the PVD chamber using an Ar gas based plasma and an alloy target and a compound element target, for example, a CoFe target and a B target. The Ta, Mo, W, or Hf layer of the magnetic storage layer 120 can be sputtered in the PVD chamber using a Ta target, a Mo target, a W target, or a Hf target.

At operation 148, the capping layer 122 is deposited on the magnetic storage layer 120. In an embodiment, the first capping interlayer 122A of the capping layer 222 is formed in a PVD chamber that may be different than the PVD chamber where non-oxide layers are formed, as both Ar plasma and $O_2$ are present in the PVD chamber during operation 148 when oxide layers are formed. The first capping interlayer 122A is deposited in the PVD chamber by sputtering a Mg target using an Ar plasma, $O_2$ is also present in the PVD chamber. In another example at operation 148, the first capping interlayer 122A is formed in the PVD chamber using an MgO sputtering target and Ar plasma. In an example where the first capping interlayer 122A is to be formed of the same material (e.g., Mg) as the tunnel barrier layer 118, the PVD chamber used for operation 144 can be the same PVD chamber that is used for operation 148 to form the first capping interlayer 122A. The second capping interlayer 122B is deposited on the first capping interlayer 122A at operation 150. If $O_2$ is used in operation 148, operation 150 can occur in a separate, different, PVD chamber than that used to sputter the first capping interlayer 122A, since there is no $O_2$ used in the PVD chamber to form the first capping interlayer 122A. The second capping interlayer 122B is formed in a PVD chamber using Ar plasma and one or more sputtering targets composed of Ru, Ir, and/or Ta. Depending upon the composition of the second capping interlayer 122B, operation 150 may occur in a PVD chamber that is also used to form, for example, the SyF coupling layer 110 at operation 136.

Further in the method 1006, at operation 152, a hardmask layer 124 is deposited over the second capping interlayer 122B in a PVD chamber. Depending upon the type of hardmask layer 124 used in the MTJ stack 100A, operation 152 may or may not occur in the presence of $O_2$. For example, if the hardmask layer 124 is a metal-oxide hardmask, an $O_2$ and Ar based plasma can be used during operation 152 along with a metallic sputtering target or targets to form the metal-oxide layer, or a metal-oxide sputtering target can be used to deposit the hardmask layer 124, in which case $O_2$ is not used in hardmask layer 124 formation at operation 150. In some embodiments, when the hardmask layer 124 is amorphous carbon or spin-on carbon, operation 152 occurs in a CVD or spin-on deposition chamber.

Further in the method 1006, the MTJ stack 100A (or MTJ stack 200 shown below in FIG. 2A) formed at operations 128A-152 can be subjected to one or more processes that are collectively indicated by operation 154 in the method 1006. These operations can include high-temperature (on the order of 400° C.) operations. In one example, the processes at operation 154 may include a pre-patterning anneal operation, which is followed by an MTJ patterning operation. In an alternate embodiment, the MTJ patterning at operation 154 can include a plurality of processes such as patterning the hardmask layer 124 and can further include an operation to etch the MTJ stack 100A after the hardmask layer 124 is patterned to form a plurality of individual pillars from the MTJ stack 100A using the patterned hardmask layer as an etch mask.

In an alternate embodiment at operation 154, a thermal annealing operation is executed to repair, crystallize, and enhance lattice structures of the film stack, including the magnetic storage layer(s) and the magnetic reference layer(s) in the MTJ stack 100A. The thermal annealing performed at operation 154 can act to further crystallize at least the material of the magnetic reference layer(s) 116 and magnetic storage layer(s) 120. The crystallization of the magnetic reference layer(s) and magnetic storage layer(s) upon deposition of those layers establishes the perpendicular anisotropy of the MTJ stack 100A, while maintaining its desired electrical and mechanical properties. Embodiments of MTJ stacks fabricated following the operations of the method 1006 are shown and discussed below, and the embodiments are configured to maintain the as-deposited face-centered cubic (fcc) <111> crystalline structure of the pinning layers after the thermal annealing operation executed at operation 154, and/or during additional or alternate back end processing operations that occur at high temperatures on the order of 400° C. The MTJ stacks fabricated according to embodiments of the present disclosure include a SyF coupling layer in between a first pinning layer and a second pinning layer. In an embodiment, the first pinning layer includes a first lattice-matching layer and the second pinning layer includes a second lattice-matching layer, each of the first lattice-matching layer and the second lattice-matching layer is formed of platinum (Pt) or palladium (Pd). The first lattice-matching layer of the first pinning layer and the second lattice-matching layer of the second pinning layer are referred to as such herein at least in part because the materials from which each of the first and the second lattice matching layers are fabricated are selected to have a lattice constant within about +/−4% of the material from which the SyF coupling layer is fabricated. The SyF coupling layer is in contact with each of the first lattice-matching layer of the first pinning layer and the second lattice-matching layer of the second pinning layer. This is in contrast to other MTJ stacks where the SyF coupling layer is in contact with a Co layer of the first pinning layer and a Co layer of the second pinning layer In an embodiment, each of the first pinning layer and/or the second pinning layer further include at least one bilayer formed in contact with the respective lattice-matching layer. In one example, each of the first lattice-matching layer from the first pinning layer and the second lattice-matching layer from the second pinning layer are in contact with the SyF coupling layer, and the SyF coupling layer is formed from Ir. Each bilayer includes a first interlayer and a second interlayer. In one example of the first pinning layer, the first pinning layer includes the first lattice-matching layer and a bilayer including a first interlayer of Co and a second interlayer of Ni. In another example of the first pinning layer, the first pinning layer includes the first lattice-matching layer and the at least one bilayer includes a first interlayer of Co and a second interlayer of Pt. In another example of the first pinning layer, the first pinning layer includes the first lattice-matching layer and the at least one bilayer includes a first interlayer of Co and a second interlayer of Pd. In an example of the second pinning layer, the second pinning layer includes the second lattice-matching layer and a bilayer including a first interlayer of Co and a second interlayer of Pt. In another example, the second pinning layer includes the second lattice-matching layer and a bilayer including a first interlayer of Co and a second interlayer of Pd. In another example, the second pinning layer includes the second lattice-matching layer and a bilayer that includes a first interlayer of Co and a second interlayer of Ni. The second lattice-matching layer is in contact with the SyF coupling layer, which includes Ir. Further in an example of the second pinning layer, a Co layer is formed over the one or more bilayers and is in contact with the structure blocking layer.

Depending upon the embodiment, the first pinning layer and the second pinning layer can each include the same layer structure, materials, and/or thickness, or can vary in layer structure, materials, and/or thickness. Using the MTJ stacks discussed herein, there is an improved lattice matching between the first pinning layer and the SyF coupling layer, and between the SyF coupling layer and the second pinning layer. The improved lattice matching reduces the effect of a dipole field on the magnetic storage layer as discussed below. Lattice matching as discussed herein includes fabricating layers including the first pinning layer, the second pinning layer, and the SyF coupling layer such that a difference in the lattice constants, referred to herein as the lattice mismatch, between the first pinning layer and the SyF coupling layer is reduced, as is the lattice mismatch between the second pinning layer and the SyF coupling layer. The lattice mismatch is defined in equation (1):

$$LM = [(a_1 - a_2)/a_1] \times 100 \quad (1)$$

In equation (1), $a_1$ is a lattice constant of a first material and $a_2$ is a lattice constant of a second material. In embodiments of the present disclosure, the lattice mismatch between the SyF coupling layer of the MTJ stack and the first pinning layer is less than about +/−4%, and the lattice mismatch between the SyF coupling layer and the second pinning layer is less than +/−4%.

Further in the MTJ stacks discussed herein, when each of the first pinning layer and the second pinning layer includes at least one bilayer, a ratio of the thickness of the interlayers of each bilayer of the first pinning layer and the second pinning layer can be adjusted so as to reduce a dipole field effect on the stack when a magnetic field is applied. The thickness ratios discussed herein can be calculated for each bilayer in a pinning layer, if more than one bilayer is used. In other examples, a thickness ratio can be calculated as an average across bilayers, such that the thickness ratio for a pinning layer is calculated using an average of the first interlayer thickness and an average of the second interlayer thickness across the bilayers of the pinning layer. The thickness ratio is discussed in detail below, and is a calculation of a thickness of a first interlayer of a bilayer of a pinning layer and a thickness of a second interlayer of the bilayer of a pinning layer. Using the MTJ stacks discussed herein, the crystal structures of the SyF coupling layer and the magnetic coupling of the magnetic reference layer and the magnetic storage layer are substantially maintained in the same as-deposited state, even after annealing. For example, the MTJ stacks discussed herein can be for a period of from 0.5 hours to at least 3 hours at about 400° C., and the magnetic and electric properties of the MTJ stacks are thus maintained.

FIG. 2A is a schematic illustration of an MTJ stack 200 according to an embodiment of the present disclosure. In the illustrated embodiment, a buffer layer 204 is formed via sputtering in a PVD chamber on a conductive portion of a substrate 202, or on a conductive film layer on the substrate 202. The substrate 202 can include one or more of tungsten (W), tantalum nitride (TaN), titanium nitride (Tin), or other metal layers. The buffer layer 204 improves the adhesion of a seed layer 206 to the substrate 202. The improved adhesion of the seed layer 206 to the substrate 202 aids in the formation and performance of subsequently-deposited layers of the MTJ stack 200. The buffer layer 204 includes $Co_xFe_yB_z$, Ta, and/or TaN, and is formed in one or more PVD deposition operations in a PVD chamber using Ar plasma. In one example, the buffer layer 104 is formed in a PVD chamber using Ar plasma and a sputtering target that is a $Co_xFe_yB_z$ alloy. In another example, the buffer layer 104 is formed using individual sputtering targets of Co, Fe, or B. In another example, the buffer layer 104 is formed by using a combination of an alloy sputtering target and a single-element sputtering target, e.g., a CoFe target and a B target. In an example where a Ta layer is included in the buffer layer 204, the Ta layer can be formed in a PVD chamber using a Ta target and Ar plasma.

In one example, the buffer layer 204 includes TaN and it is sputtered onto the substrate 202 in the PVD chamber using a Ta target, Ar plasma, and $N_2$. The $N_2$ reacts with the Ta material sputtered from the Ta target to form the TaN layer. In another example, a TaN sputtering target is used in the PVD chamber with Ar plasma to form the buffer layer 204. In one example, the buffer layer 204 is sputtered directly on and in contact with a conductive layer on the substrate 202. In other examples, there is a conductive transitional layer in between the conductive layer on the substrate 202 and the buffer layer 204 that does not affect performance of the MTJ stack. The buffer layer 204 is optionally employed in the illustrated embodiment, and may not be used in some embodiments discussed herein. When a buffer layer 204 is employed, an overall thickness of the buffer layer 204 is from 0 Å (no buffer layer used) to about 60 Å. In one example, the buffer layer 204 is a single layer of Ta, TaN, or $Co_xFe_yB_z$ sputtered directly on, and in contact with, a conductive layer on the substrate 202 to a thickness of up to 10 Å. In another example, the buffer layer 204 is a combination of two or more layers, and each layer of the buffer layer 204 is Ta, TaN, or $Co_xFe_yB_z$. In this example, each layer of the buffer layer 204 can be from 1 Å to 60 Å thick. In an example where the buffer layer 204 is formed from TaN instead of Ta or $Co_xFe_yB_z$, the buffer layer 204 can be up to 20 Å thick. In another example, which can be combined with other examples herein, where $Co_xFe_yB_z$ is employed alone to form the buffer layer 204. In this example, the buffer layer 204 can have a thickness of about 10 Å. In another example at least one of Ta or TaN is employed in conjunction with $Co_xFe_yB_z$, to form the buffer layer 204. In this example, an average thickness of the buffer layer 204 is about 20 Å.

The seed layer 206 is deposited in a PVD chamber via sputtering one or more targets. The seed layer 206 is deposited on the buffer layer 204. The seed layer 206 includes Cr or Pt. The formation of the seed layer 206 in the PVD chamber is discussed in detail above at operation 132. In an embodiment, the seed layer 206 is 100 Å or less in thickness. In one example, which can be combined with other examples herein, the seed layer 206 is from about 30 Å to about 60 Å thick. In one example, the seed layer 206 is formed directly on and in contact with the buffer layer 204. In other examples, there is a transitional layer in between the seed layer 206 and the buffer layer 204 that does not affect performance of the MTJ stack.

Further in the MTJ stack 200, a first pinning layer 208 is formed on the seed layer 206 in a PVD chamber. The formation of the first pinning layer 208 is shown in detail above at operation 134 of the method 100B in FIG. 1B, and occurs in a PVD chamber using Ar or Xe plasma and one or more sputtering targets. In one example, the first pinning layer 208 is fabricated as one or more bilayers of various materials and a lattice-matching layer formed over the one or more bilayers, such that the lattice-matching layer of the first pinning layer is in contact with the SyF coupling layer 210, as shown in FIG. 2C. The lattice-matching layer of the first pinning layer 208 can be formed from Pt or Pd. The first pinning layer 208 is deposited over the one or more bilayers using Xe plasma using a Pt or Pd sputtering target. In an example where one or more bilayers are included in the first pinning layer 208, each bilayer contains a first interlayer of Co and a second interlayer of another element or alloy. The at least one bilayer of the first pinning layer 208 is formed by sputtering a Co target using Ar plasma and, subsequently, sputtering a second target of Pt, Ni, or Pd, or combinations or alloys thereof, using the Ar or Xe plasma. In an example where a Pt is target sputtered in addition to a Co target to form the bilayer of the first pinning layer 208, Xe plasma may be used instead of or in addition to Ar plasma. In an embodiment where one or more bilayers are used to form the first pinning layer, repeated deposition cycles in the PVD chamber can be performed by forming a first interlayer of a bilayer, where the first interlayer includes Co. The first interlayer of the bilayer can be formed by shielding targets that do not include Co, and, subsequently, by shielding the Co target and other targets to expose a second target that includes a second element to be used to deposit the second interlayer of the bilayer. The deposition of the first interlayer and the second interlayer may be repeated in an iterative fashion to form one or more bilayers of the first pinning layer 208. In one example, the first pinning layer 208 is formed in the PVD chamber directly on and in contact with the seed layer 206. In other examples, there is a transitional layer in between the seed layer 206 and the first pinning layer 208 that does not affect performance of the MTJ stack.

A synthetic anti-ferromagnetic (SyF) coupling layer 210 is deposited in a PVD chamber on the first pinning layer 208, and a second pinning layer 212 is sputter deposited on the SyF coupling layer 210. The SyF coupling layer 210 is formed in the PVD chamber using Kr or Xe plasma with a Ru sputtering target, an Rh sputtering target, a Cr sputtering target, or an Ir sputtering target. The SyF coupling layer 210 has a thickness from about 3 Å to about 10 Å. In an embodiment, the second pinning layer 212 is fabricated by sputtering a Pt target or a Pd target in a PVD chamber using an Ar or Xe plasma to form a lattice-matching layer of the second pinning layer 212 on the SyF coupling layer 210. In some examples, the second pinning layer 212 includes at least one bilayer formed over the lattice-matching layer. The at least one bilayer of the second pinning layer 212 includes a first interlayer of Co and a second interlayer of Ni, Pd, or Pt, or combinations or alloys thereof. In one example, the SyF coupling layer 210 is formed directly on and in contact with the lattice-matching layer of first pinning layer 208 and the lattice-matching layer of the second pinning layer 212. In other examples, there is a transitional layer in between the SyF coupling layer 210 and either or both of the first pinning layer 208 or second pinning layer 212 that does not affect performance of the MTJ stack.

The formation of the second pinning layer 212 is discussed at operation 138 of the method 100B in FIG. 1B above. The second pinning layer 212 includes a lattice-matching layer of Pt or Pd formed on the SyF coupling layer 210, as well as one or more bilayers formed over the lattice-matching layer. The lattice-matching layer of the second pinning layer 212 can be formed to a thickness up to 3 Å by sputtering a Pt target or a Pd target using Xe plasma. In an example where one or more bilayers are included in the second pinning layer 212, a first bilayer is formed on the lattice-matching layer and includes a first interlayer of Co and a second interlayer of another element such as Pd, Ni, or Pt, or combinations or alloys thereof. The bilayer is formed by sputtering a Co target using an Ar plasma and, subsequently, by sputtering a second target of Pt, Ni, or Pd, or combinations or alloys thereof, using Xe or Ar plasma. In an embodiment, repeated deposition cycles of the first interlayer and the second interlayer in a PVD chamber using the Co target and the second target can be used to form the one or more bilayers of the second pinning layer 212. A thickness of each bilayer of the second pinning layer 212 can be from about 4 Å to about 15 Å. In an example, the thickness of the second pinning layer 212 is from about 0.3 nm to 15 nm. Alternate configurations of the second pinning layer 212 are shown in FIG. 2D.

In an embodiment where the first pinning layer 208 and the second pinning layer 212 each include one or more bilayers, a thickness ratio can be defined for each pinning layer. The thickness ratios discussed herein are a ratio of a thickness of the interlayers of the one or more bilayers of each pinning layer. A thickness ratio as discussed herein can be expressed as (X:Y), where X is a thickness of the first interlayer that includes Co, Y is a thickness of the second interlayer of Pt, Ni, or Pd, or an alloy of Pt, Ni, and/or Pd, and z indicates the layer associated with the thickness ratio, for example, whether the thickness ratio is for the first pinning layer 208 or the second pinning layer 212. In one example, the first interlayer of the first pinning layer 208 is from 1 Å to 8 Å thick and the second interlayer of the first pinning layer 208 is from 1 Å to 8 Å thick. In another example, the first interlayer of the second pinning layer 212 is from 1 Å to 8 Å thick and the second interlayer of the second pinning layer 212 is from 1 Å to 8 Å thick. In this example, a thickness ratio of the first pinning layer 208 [(Co:Y)$_{208}$] is greater than a second pinning layer 212 thickness ratio [(Co:Y)$_{212}$].

Subsequent to fabrication of the MTJ stack 200, operations including etching the MTJ stack 200 can be performed as part of MRAM device fabrication. After etching, when a magnetic field is applied to the MRAM device, a magnetic dipole field is generated from the first pinning layer 208 to a magnetic storage layer 220 (discussed below). The dipole field can negatively impact the performance of layers of the MTJ stack 200, including the magnetic storage layer 220. Since the second pinning layer 212 is closer to the magnetic storage layer 220 than the first pinning layer 208 in the MTJ stack 200, a thickness ratio of the first pinning layer 208 is greater than the thickness ratio of the second pinning layer 212, which minimizes dipole field experienced by the magnetic storage layer 220. Accordingly, by increasing the magnetic material content of the first pinning layer 208 as compared to the magnetic material content of the second pinning layer 212, the dipole field experienced by the magnetic storage layer 220 is reduced. The magnetic material content of the first or second pinning layers is an amount of a material such as Co or Ni that is capable of retaining magnetization in response to the application of a magnetic field. This is in contrast to materials such as Pt or Pd which can also be used to form one or more pinning layers. In one example, a thickness ratio of the first pinning layer (Co:Y)$_{208}$ can be from 1:1 to 8:1, and a thickness ratio of the second pinning layer (Co:Y)$_{212}$ can be from 1:1 to 8:8. In this example, an MTJ stack 200 includes the first pinning layer 208 with a thickness ratio (Co:Y)$_{208}$ of 8:1, and the second pinning layer 212 with a thickness ratio (Co:Y)$_{212}$ of 8:8. In another example, an MTJ stack 200 includes the first pinning layer 208 with a thickness ratio (Co:Y)$_{208}$ of 8:3, and the second pinning layer 212 with a thickness ratio (Co:Y)$_{212}$ of 3:7. In other examples, the ratios (Co:Y)$_{208}$ and (Co:Y)$_{212}$ can further vary, with [(Co:Y)$_{208}$>(Co:Y)$_{212}$]. When Y is a magnetic material such as Ni, the thickness ratios can be further tailored depending upon the embodiment, and/or a fewer number of bilayers can be used to form the second pinning layer 212 than the number of bilayers that is used to form the first pinning layer 208. In some examples, the second pinning layer 212 does not include a bilayer.

Further in the MTJ stack 200, a structure blocking layer 214 is optionally formed on the second pinning layer 212 by sputtering a material layer thereon in a PVD chamber. The structure blocking layer 214 prevents against formation of a short circuit between the MTJ stack 200 and metallic contacts that can be coupled to the MTJ stack 200 to form MRAM memory cells. In one example, during deposition of the structure blocking layer 214 in the PVD chamber, depending upon the intended composition of the layer, one or more individual Ta, Mo, or W sputtering targets can be sputtered the PVD chamber using Ar plasma. In another example, during deposition of the structure blocking layer 214 in the PVD chamber, or one or more alloy targets including alloys of Ta, Mo, and/or W can be sputtered in the PVD chamber using Ar plasma. The structure blocking layer 214 is a body-centered-cubic (bcc) structure oriented in the <100> direction, in contrast to the seed layer 206 and the first pinning layer 208 and the second pinning layer 212 which can each be oriented in a face-centered-cubic <111> direction. The structure blocking layer 214 is from 0 (no layer) Å to about 8 Å thick, and, in one example, a thickness of 4 Å is sputter deposited. In one example, the structure blocking layer 214 is formed directly on and in contact with the second pinning layer 212 by sputter deposition. In other examples, there is a transitional layer in between the structure blocking layer 214 and the second pinning layer 212 that does not affect performance of the MTJ stack.

A magnetic reference layer 216 is formed on the structure blocking layer 214 by sputter deposition in a PVD chamber using Ar plasma. The magnetic reference layer 216 can be deposited in the PVD chamber using a single Co—Fe—B alloy sputtering target, or by using two or more of a Co sputtering target, an Fe sputtering target, or a B sputtering target. In another example, the magnetic reference layer 216 can be formed in the PVD chamber using Ar plasma, an alloy target, and an element target, such as a CoFe target and a B target. The magnetic reference layer 216 can be sputtered to a thickness from 1 Å to 15 Å, and, in one example, can be formed to a thickness of 10 Å. The magnetic reference layer 216 includes Co$_x$Fe$_y$B$_z$ where z is from about 10 wt. % to about 40 wt. %, y is from about 20 wt. % to about 60 wt. %, and x is equal to or less than 70 wt. %. In an embodiment, z is at least 20 wt. %. In one example, the magnetic reference layer 216 is formed directly on and in contact with the structure blocking layer 214. In other examples, there is a transitional layer between the magnetic reference layer 216 and the structure blocking layer 214 that does not affect performance of the MTJ stack.

A tunnel barrier layer 218 is formed on the magnetic reference layer 216 using sputtering of a target in a PVD chamber in an Ar plasma. The tunnel barrier layer 218 includes a metal-oxide such as magnesium oxide (MgO), hafnium oxide (HfO$_2$), titanium oxide (TiO$_2$), tantalum oxide (TaO$_x$), aluminum oxide (Al$_2$O$_3$), or other materials as appropriate for various applications. Thus, the tunnel barrier layer 218 can be formed in the PVD chamber using Ar plasma and a sputtering target of a metal-oxide. Alternately, the tunnel barrier layer 218 can be formed in the PVD chamber using Ar plasma, O$_2$, and a sputtering target of the metal of the desired metal-oxide, where the metal-oxide layer is formed when the metal layer sputtered from the metal sputtering target is exposed to the O$_2$. The tunnel barrier layer 218 has a thickness from 1 Å to 15 Å, with a thickness of 10 Å in some embodiments. In one example, tunnel barrier layer 218 is formed directly on and in contact with the magnetic reference layer 216. In other examples, there is a transitional layer between the tunnel barrier layer 218 and the magnetic reference layer 216 that does not affect performance of the MTJ stack.

In an embodiment, the MTJ stack 200 further includes a magnetic storage layer 220 formed on the tunnel barrier layer 218 using a sputtering operation in a PVD chamber as discussed herein. The magnetic storage layer 220 can include one or more layers of Co$_x$Fe$_y$B$_z$, and, in some examples, one or more layers of Ta, Mo, W, or Hf. As such, the deposition of the magnetic storage layer 220 in the PVD chamber can include using Ar plasma, a Co$_x$Fe$_y$B$_z$ alloy target, or individual targets of Co, Fe, and B, or a combination of an alloy target and an element target such as a CoFe target and a B target. In examples where the magnetic storage layer 220 is formed from one or more of Ta, Mo, W, or Hf, a sputtering target of Ta, Mo, W, or Hf is sputtered in the chamber using a plasma formed of Ar.

Figure 2E:
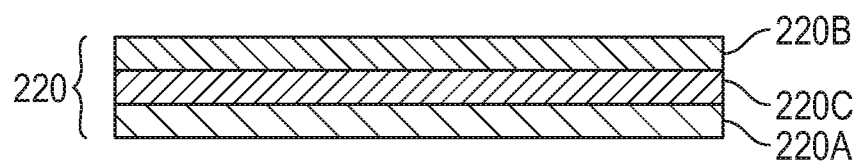
FIG. 2E is a magnified view of an example magnetic storage layer of an MTJ stack according to embodiments of the present disclosure.

The magnetic storage layer 220 is from about 5 Å to about 20 Å in thickness depending upon factors including a material or materials used to form the magnetic storage layer 220. In one example, the magnetic storage layer is fabricated from $Co_xFe_yB_z$ where z is from about 10 wt. % to about 40 wt. %, y is from about 20 wt. % to about 60 wt. %, and x is equal to or less than 70 wt. %. In this example, the thickness of the magnetic storage layer 220 is from 5 Å to 40 Å. In another example, the thickness of the magnetic storage layer 220 is about 20 Å. In one example, the magnetic storage layer 220 is formed directly on and in contact with the tunnel barrier layer 218. In other examples, there is a transitional layer in between the magnetic storage layer 220 and the tunnel barrier layer 218 that does not affect performance of the MTJ stack. The magnetic storage layer is shown in FIG. 2E below.

Figure 2F:
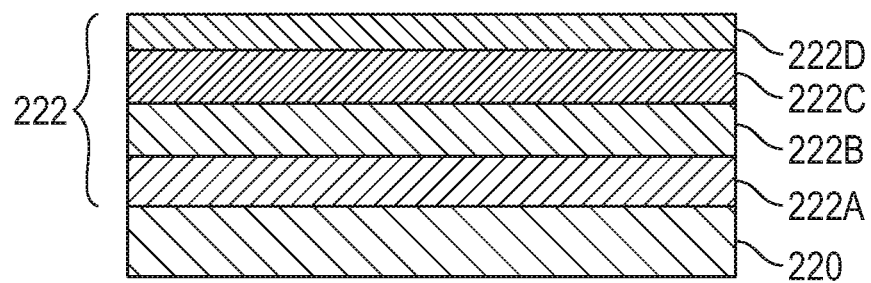
FIG. 2F is a magnified view of an example capping layer of an MTJ stack according to embodiments of the present disclosure.

Further in an embodiment of the MTJ stack 200, a capping layer 222 is formed on the magnetic storage layer 220, and includes a plurality of interlayers that form the capping layer 222, including an oxide that contains iron (Fe). Additionally, in some embodiments, a hard mask layer 224 is formed directly on and in contact with the capping layer 222. In another example, the hard mask layer 224 is formed on the capping layer 222 with a transitional layer in between the capping layer 222 and the hard mask layer 224; such transitional layer does not affect the performance of the MTJ stack 200. The hard mask layer 224 may be formed of a metal-oxide, amorphous carbon, ceramics, metallic materials, or combinations thereof. In one example, the magnetic storage layer 220 is formed directly on and in contact with the capping layer 222. In other examples, there is a transitional layer between the magnetic storage layer 220 and the capping layer 222 that does not affect performance of the MTJ stack 200. The capping layer 222 is shown in FIG. 2F below.

FIG. 2B is a magnified view of the buffer layer 204 according to embodiments of the present disclosure. The buffer layer 204 can be formed from tantalum (Ta) or TaN. In another example, which can be combined with other examples, the buffer layer 204 includes a layered stack of Ta and TaN In other examples that can be combined with examples herein, the buffer layer 204 includes $Co_xFe_yB_z$, alone or in combination with Ta, TaN, or a Ta/TaN layered stack. In one example of the buffer layer 204, the buffer layer 204 includes at least one bilayer 204D. The at least one bilayer 204D includes a first buffer interlayer 204A and a second buffer interlayer 204B formed in an alternating fashion on the substrate 202 for at least one iteration of the at least one bilayer 204D. In this example, the first buffer interlayer 204A is formed from Ta and the second buffer interlayer 204B is formed from TaN, and the first buffer interlayer 204A is in contact with the substrate 202. In another example the first buffer interlayer 204A is formed from TaN and the second buffer interlayer 204B is formed from Ta, and, thus, TaN is in direct contact with the substrate 202.

In other examples of the buffer layer 204, as shown in FIG. 2A, $Co_xFe_yB_z$ is used alone for the buffer layer 204 and would thus be in direct contact with the substrate 202. In another example, as shown in FIG. 2B, a third buffer layer 204C is formed over the at least one bilayer 204D. In this example, the third buffer layer 204C is fabricated from $Co_xFe_yB_z$ and formed to a thickness of up to 10 Å. Thus, depending upon the configuration of the buffer layer 204, a thickness of the buffer layer 204 ranges from 1 Å thick to 60 Å thick. In an example where the third buffer layer 204C $Co_xFe_yB_z$ is employed, z is from about 10 wt. % to about 40 wt. %, y is from about 20 wt. % to about 60 wt. %, and x is equal to or less than 70 wt. %.

FIG. 2C is a magnified view of the first pinning layer 208 according to an embodiment of the present disclosure. In an embodiment, the first pinning layer 208 is fabricated from at least one bilayer 230, and when two or more bilayers are employed, the two or more bilayers can be said to form a bilayer stack 234. Each bilayer 230 is fabricated from a first interlayer 208A and a second interlayer 208B. The bilayers of the first pinning layer 208 are expressed as $(X/Y)_n$, $(208A/208B)_n$, where each bilayer is a combination of a first material X and a second, different, material Y, and where n is a number of bilayers in the first pinning layer 208. In an embodiment, X is Co and Y is one of Pt, Ni, or Pd. While n=4 in the example in FIG. 2C, in alternate embodiments, n is from 1 to 10. In an embodiment, the at least one bilayer 230 has a thickness from about 2 Å to about 16 Å. In one example, the first interlayer 208A is formed from Co and is from about 1 Å to about 8 Å thick. The second interlayer 208B can be formed from Pt, Pd, or Ni, or combinations or alloys thereof, and is from about 1 Å to about 8 Å thick. Further in another embodiment of the first pinning layer 208, the at least one bilayer 230 is formed directly on and in contact with the seed layer 206, and a lattice-matching layer 208C is formed on top of the at least one bilayer 230. In an MTJ stack such as the MTJ stack 200 in FIG. 2A, the lattice-matching layer 208C is in contact with the SyF coupling layer 210. In an embodiment, the lattice-matching layer 208C is from 1 Å to 3 Å thick. In this example, the lattice-matching layer 208C is Pt, and in another example, the lattice-matching layer 208C is Pd. Depending upon the embodiment, an overall thickness of the first pinning layer 208, which may include one or more layers including the lattice-matching layer 208C and, in some examples, the at least one bilayer 230, is from 1 nm to about 18 nm. In other examples, one or more transitional layers may be formed between the first pinning layer 208 and the seed layer 206 that do not negatively affect the properties of the MTJ stack.

FIG. 2D is a magnified view of the second pinning layer 212 according to embodiments of the present disclosure. In an embodiment, the second pinning layer 212 is fabricated from a lattice-matching layer 212A, and the lattice-matching layer 212A is formed on and contact with the SyF coupling layer 210. In an embodiment, the lattice-matching layer 212A includes a layer of Pt or Pd from 1 Å to 3 Å thick. In one example of the second pinning layer 212, at least one bilayer 232 is formed over the lattice-matching layer 212A. Each bilayer 232 includes a first interlayer 212B that can be Co and a second interlayer 212C that can be Pt, Ni, or Pd, or combinations or alloys thereof. When two or more bilayers such as the bilayer 232 are employed in the second pinning layer 212, the two or more bilayers may be referred to as a bilayer stack 236. Thus, when one or more bilayers are deposited at operation 138, as show in FIG. 1B, a separate sputtering target may be used to form each of the first interlayer 208A and the second interlayer 208B of the bilayer 230. The at least one bilayer 232 of the second pinning layer 212 is expressed as $(X/Y)_n$, $(212A/212B)_n$, where n is a number of bilayers. While n=4 in the example in FIG. 2D, in alternate embodiments, n is from 1 to 5. In an embodiment, the at least one bilayer 232 has a total thickness from about 2 Å to about 16 Å. In one example, the first interlayer 212B is a Co layer from about 1 Å to about 8 Å thick and the second interlayer 212C is from about 1 Å to about 8 Å thick. In various embodiments, the second interlayer 212C includes Ni, Pt, or Pd or combinations or alloys thereof.

Further in another embodiment, the second pinning layer 212 includes an overlayer 212D of Co formed on top of the at least one bilayer 232. In other examples of the second pinning layer 212, no overlayer 212D is present. In another example, not shown in FIG. 2D, the overlayer 212D of Co is formed on the lattice-matching layer 212A. In an embodiment, the overlayer 212D is from about 1 Å to about 10 Å thick. Depending upon the embodiment, an overall thickness of the second pinning layer 212, which may include one or more layers including the at least one bilayer 232 as discussed herein, is from 0.3 nm to 15 nm. In some examples, a transitional layer may be employed between the at least one bilayer 232 and the second pinning layer 212. In other examples, a transition layer can be formed between the at least one bilayer 232 and the SyF coupling layer 210. In other examples, a transition layer can be formed between the at least one bilayer 232 and the second pinning layer 212 and between the at least one bilayer 232 and the SyF coupling layer 210. Such transition layer(s) do not affect performance of the MTJ stack.

In an embodiment, the first pinning layer 208 and second pinning layer 212 each include the same interlayer composition and/or a differing interlayer thickness. In an alternate embodiment, the first pinning layer 208 and second pinning layer 212 each include different compositions and/or thicknesses. In an embodiment, the first pinning layer 208 includes at least one bilayer including a first interlayer of Co and a second interlayer of Pt, and further includes a first lattice-matching layer of Pt or Pd formed over the at least one bilayer. The first lattice-matching layer of the first pinning layer 208 is in contact with an SyF coupling layer 210 formed from Ir. In this example, the second pinning layer 212 is formed over the SyF coupling layer 210 and includes a second lattice-matching layer of Pt or Pd formed in contact with the SyF coupling layer 210. In some examples, the second pinning layer 212 further includes one or more bilayers formed over the second lattice-matching layer. In an embodiment, the one or more bilayers of the second pinning layer 212 include a first interlayer of Co and a second interlayer of Pt. In another embodiment, the first pinning layer 208 includes at least one bilayer including a first interlayer of Co and a second interlayer of Ni, and further includes a first lattice-matching layer of Pt or Pd formed over the at least one bilayer such that the first lattice-matching layer is in contact with the SyF coupling layer 210 formed from Ir. In this example, the second pinning layer 212 includes a second lattice-matching layer of Pt or Pd formed in contact with the SyF coupling layer 210 and, optionally, includes one or more bilayers formed over the second lattice-matching layer. In this example, the one or more bilayers of the second pinning layer 212 include a first interlayer of Co and a second interlayer of Pt.

FIG. 2E is a magnified view of an example magnetic storage layer 220 according to embodiments of the present disclosure. As shown in FIG. 2E, a first magnetic layer 220A of the magnetic storage layer 220 and a second magnetic layer 220B of the magnetic storage layer 220 are each fabricated from $Co_xFe_yB_z$. A third layer 220C fabricated from Ta, Mo, W, Hf, or combinations thereof are disposed therebetween. The third layer 220C can contain dopants such as boron, oxygen, or other dopants. The magnetic storage layer 220 is thus fabricated from three layers, a first magnetic layer 220A and a second magnetic layer 220B, and a third layer 220C disposed between the first magnetic layer 220A and the second magnetic layer 220B. The third layer 220C strengthens a pinning moment perpendicular to the substrate plane (e.g., a plane perpendicular to the substrate 202), which promotes magnetic anisotropy, a directional dependence of the structure's magnetic properties.

FIG. 2F is a magnified view of an example capping layer 222 according to an embodiment of the present disclosure. A total thickness of the capping layer 222 is from 2 Å to 120 Å and in some embodiments a total desired thickness for the capping layer (e.g., including all interlayers as shown in FIG. 2F) is about 60 Å. In an embodiment, the capping layer 222 includes a plurality of interlayers. A first capping interlayer 222A is fabricated from MgO or another iron-containing oxide formed directly on the magnetic storage layer 220 to a thickness from about 2 Å to about 10 Å. On top of the first capping interlayer 222A, a second capping interlayer 222B of Ru, Ir, or combinations thereof is formed to a thickness from 1 Å to about 30 Å. In an embodiment, a third capping interlayer 222C is optionally formed of Ta on the second capping interlayer 222B to a thickness of 1 Å to about 30 Å. Thus, some embodiments of a capping layer 222 do not contain a third capping interlayer 222C. In an embodiment, a second capping interlayer 222D is optionally formed on the third capping interlayer 222C and is formed of Ru, Ir, or combinations thereof to a thickness of up to 50 Å. In various embodiments, the capping layer 222 includes only the first capping interlayer 222A, or the first capping interlayer 222A and the second capping interlayer 222B, or the first capping interlayer 222A, the second capping interlayer 222B, and a third capping interlayer 222C, or the first, second, and third capping layers 222A-222C. In some embodiments, transitional layers may be used in between some or all of the first capping interlayer 222A, the second capping interlayer 222B, and the third capping interlayer 222C, or may be between the capping layer 222 and the magnetic storage layer 220, such that the performance of the MTJ stack is not negatively impacted by the transitional layer(s).

The MTJ stacks discussed herein have improved performance after undergoing processing at temperatures at or above 400° C., at least because of the lattice matching between the first pinning layer and SyF coupling layer and the lattice-matching between the second pinning layer and the SyF coupling layer The lattice matching between the SyF coupling layer and each of the first and second pinning layers inhibits roughness formation at the interface of the SyF coupling layer and the first pinning layer and at the interface of the SyF coupling layer and the second pinning layer. The roughness formation results in a lack of flatness in one or more layers which negatively impacts the performance of the MTJ stacks. Further, in an example where each of the first pinning layer and the second pinning layer includes a bilayer, a ratio of a thickness of each interlayer of each bilayer of the first pinning layer and the second pinning layer can be selected to reduce the dipole field effect when a magnetic field is applied to the MTJ stack. The MTJ stacks fabricated according to embodiments of the present disclosure are thus able to maintain structural integrity as well as desirable magnetic and electrical properties subsequent to high temperature processing.

While the foregoing is directed to embodiments of the present disclosure, other and further embodiments of the disclosure may be devised without departing from the basic scope thereof, and the scope thereof is determined by the claims that follow.

What is claimed is:

1. A device comprising:
a magnetic tunnel junction stack comprising:
a first pinning layer comprising a first bilayer and a first lattice-matching layer formed over the first bilayer, wherein the first lattice-matching layer comprises platinum or palladium;
a synthetic anti-ferrimagnetic (SyF) coupling layer in contact with the first lattice-matching layer of the first pinning layer; and
a second pinning layer in contact with the SyF coupling layer, wherein the second pinning layer comprises a second lattice-matching layer comprising platinum or palladium, the second lattice-matching layer being in contact with the SyF coupling layer.

2. The device of claim 1, wherein a total thickness of the first pinning layer and second pinning layer is from 1 nm to 18 nm and a total thickness of the second pinning layer is from 1 nm to 18 nm.

3. The device of claim 1, wherein the first lattice-matching layer is from 1 Å to 3 Å thick and the second lattice-matching layer is from 1 Å to 3 Å thick.

4. The device of claim 1, wherein the SyF coupling layer comprises ruthenium, chromium, rhodium, or iridium.

5. The device of claim 1, wherein the first pinning layer is in contact with a seed layer formed from at least one of chromium or platinum, the seed layer being from 1 Å to 100 Å thick.

6. The device of claim 1, wherein the first bilayer comprises a first interlayer of cobalt from 1 Å to 7 Å thick and a second interlayer of platinum, nickel, palladium, or alloys or combinations thereof, the second interlayer being from 1 Å to 8 Å thick.

7. The device of claim 1, wherein the second pinning layer further comprises a second bilayer comprising a first interlayer of cobalt, the first interlayer being from 1 Å to 8 Å thick and a second interlayer of platinum, nickel, or palladium or alloys or combinations thereof, the second interlayer being from 1 Å to 8 Å thick.

8. The device of claim 1, wherein the second pinning layer is from 0.3 nm to 15 nm thick.

9. The device of claim 1, further comprising:
a structure blocking layer in contact with the second pinning layer;
a magnetic reference layer in contact with the structure blocking layer;
a tunnel barrier layer in contact with the magnetic reference layer; and
a magnetic storage layer in contact with the tunnel barrier layer.

10. The device of claim 1, wherein a first lattice constant of the first lattice-matching layer and a second lattice constant of the second lattice-matching layer are each within +/−4% of a third lattice constant of the SyF coupling layer.

11. A magnetic tunnel junction stack, comprising:
a first pinning layer comprising a first plurality of bilayers and a first lattice-matching layer formed over the first plurality of bilayers, wherein the first lattice-matching layer comprises platinum or palladium, and wherein each bilayer of the first plurality of bilayers comprises a first cobalt interlayer and a second interlayer of platinum, nickel, palladium, or alloys or combinations thereof;
a synthetic anti-ferrimagnetic (SyF) coupling layer formed on the first pinning layer; and
a second pinning layer formed on the SyF coupling layer, wherein the second pinning layer comprises a second lattice-matching layer formed on the SyF coupling layer.

12. The magnetic tunnel junction stack of claim 11, wherein the second pinning layer further comprises and a bilayer formed on the second lattice-matching layer and a cobalt layer formed on the bilayer, the cobalt layer being from 1 Å to 10 Å thick.

13. The magnetic tunnel junction stack of claim 11, wherein the second lattice-matching layer comprises platinum or palladium.

14. The magnetic tunnel junction stack of claim 11, wherein the SyF coupling layer is from 3 Å to 10 Å thick and comprises ruthenium, chromium, rhodium, or iridium.

15. The magnetic tunnel junction stack of claim 11, further comprising:
a structure blocking layer on the second pinning layer, wherein the structure blocking layer comprises at least one of tantalum, molybdenum, or tungsten and is from 1 Å to 8 Å thick;
a magnetic reference layer on the structure blocking layer;
a tunnel barrier layer on the magnetic reference layer; and
a magnetic storage layer on the tunnel barrier layer.

16. A magnetic tunnel junction stack, comprising:
a buffer layer;
a seed layer comprising chromium formed over the buffer layer;
a first pinning layer in contact with the seed layer, wherein the first pinning layer comprises a first bilayer and a first lattice-matching layer formed over the first bilayer, the first lattice-matching layer being formed from at least one of platinum or palladium, and wherein the first bilayer comprises a cobalt interlayer and at least one interlayer comprising platinum, nickel, or palladium;
a synthetic anti-ferrimagnetic (SyF) coupling layer formed on the first pinning layer;
a second pinning layer formed on the SyF coupling layer, wherein the second pinning layer comprises a second lattice-matching layer formed on the SyF coupling layer, wherein the second lattice-matching layer comprises platinum or palladium;
a structure blocking layer formed on the second pinning layer, wherein the structure blocking layer comprises at least one of tantalum, molybdenum, or tungsten;
a magnetic reference layer formed on the structure blocking layer;
a tunnel barrier layer formed on the magnetic reference layer; and
a magnetic storage layer formed on the tunnel barrier layer.

17. The magnetic tunnel junction stack of claim 16, wherein the second pinning layer further comprises a second bilayer, wherein the second bilayer comprises a first interlayer of cobalt and a second interlayer of platinum, nickel, or palladium, or alloys or combinations thereof.

18. The magnetic tunnel junction stack of claim 17, wherein the second pinning layer further comprises a layer of cobalt formed over the second bilayer and in contact with the structure blocking layer.

19. The magnetic tunnel junction stack of claim 16, wherein the SyF coupling layer comprises ruthenium, chromium, rhodium, or iridium, and is from 3 Å to 10 Å thick.

20. The magnetic tunnel junction stack of claim 17, wherein the first bilayer of the first pinning layer comprises a first thickness ratio between a thickness of the first interlayer and a thickness of the second interlayer, and the second bilayer of the second pinning layer comprises a second thickness ratio between a thickness of the first interlayer and a thickness of the second interlayer, wherein the first thickness ratio is greater than the second thickness ratio.

\* \* \* \* \*